United States Patent
Davis et al.

[11] Patent Number: 5,859,764
[45] Date of Patent: Jan. 12, 1999

[54] ELECTRONICS PACKAGE EMPLOYING A HIGH THERMAL PERFORMANCE WEDGELOCK

[75] Inventors: Richard F. Davis, La Habra; Lawrence S. Mills, Fountain Valley, both of Calif.

[73] Assignee: Raytheon Company, Lexington, Mass.

[21] Appl. No.: 806,365

[22] Filed: Feb. 27, 1997

[51] Int. Cl.[6] ........................................... H05K 7/20
[52] U.S. Cl. ................. 361/704; 165/80.3; 211/41.17; 361/802
[58] Field of Search .................................. 257/718, 719, 257/726, 727; 211/41.17; 24/304, 524–526; 403/374, 409.1; 254/104; 174/16.3; 165/80.3, 185; 361/704, 707, 709–711, 715, 720, 717–719, 721, 801, 802, 796

[56] References Cited

U.S. PATENT DOCUMENTS

| | | | |
|---|---|---|---|
| 497,570 | 11/1893 | Tolle | 361/709 |
| 3,735,206 | 5/1973 | Pesek | 361/721 |
| 5,220,485 | 6/1993 | Chakrabarti | 361/720 |
| 5,262,587 | 11/1993 | Moser | 361/711 |
| 5,329,420 | 7/1994 | Altoz | 361/796 |
| 5,472,353 | 12/1995 | Hristake | 361/709 |
| 5,483,420 | 1/1996 | Schiavini | 361/801 |
| 5,485,353 | 1/1996 | Hayes | 361/802 |

*Primary Examiner*—Gerald P. Tolin
*Attorney, Agent, or Firm*—Leonard A. Alkov; Glenn H. Lenzen, Jr.

[57] ABSTRACT

A thermally conductive wedgelock having improved thermal conductivity is used to secure a circuit card assembly in a card guide slot formed in a housing of an electronics package. The circuit card assembly has a thermal mounting plate that is used to secure the assembly in the slot. The thermally conductive wedgelock secures the circuit card assembly in the housing and conductively couples heat from the circuit card assembly to the housing by way of the card guide slot. The wedgelock provides a secondary heat path to the card guide slot to housing in addition to the primary heat path through the thermal mounting plate. Apparatus is provide for expanding the wedgelock in the card guide slot to secure the circuit card assembly therein. The thermally conductive wedgelock may be made of copper or other metal having high thermal conductivity. The wedgelock preferably comprises two tapered wedges, and has a guide that prevents rotation between the adjacent wedges.

2 Claims, 2 Drawing Sheets

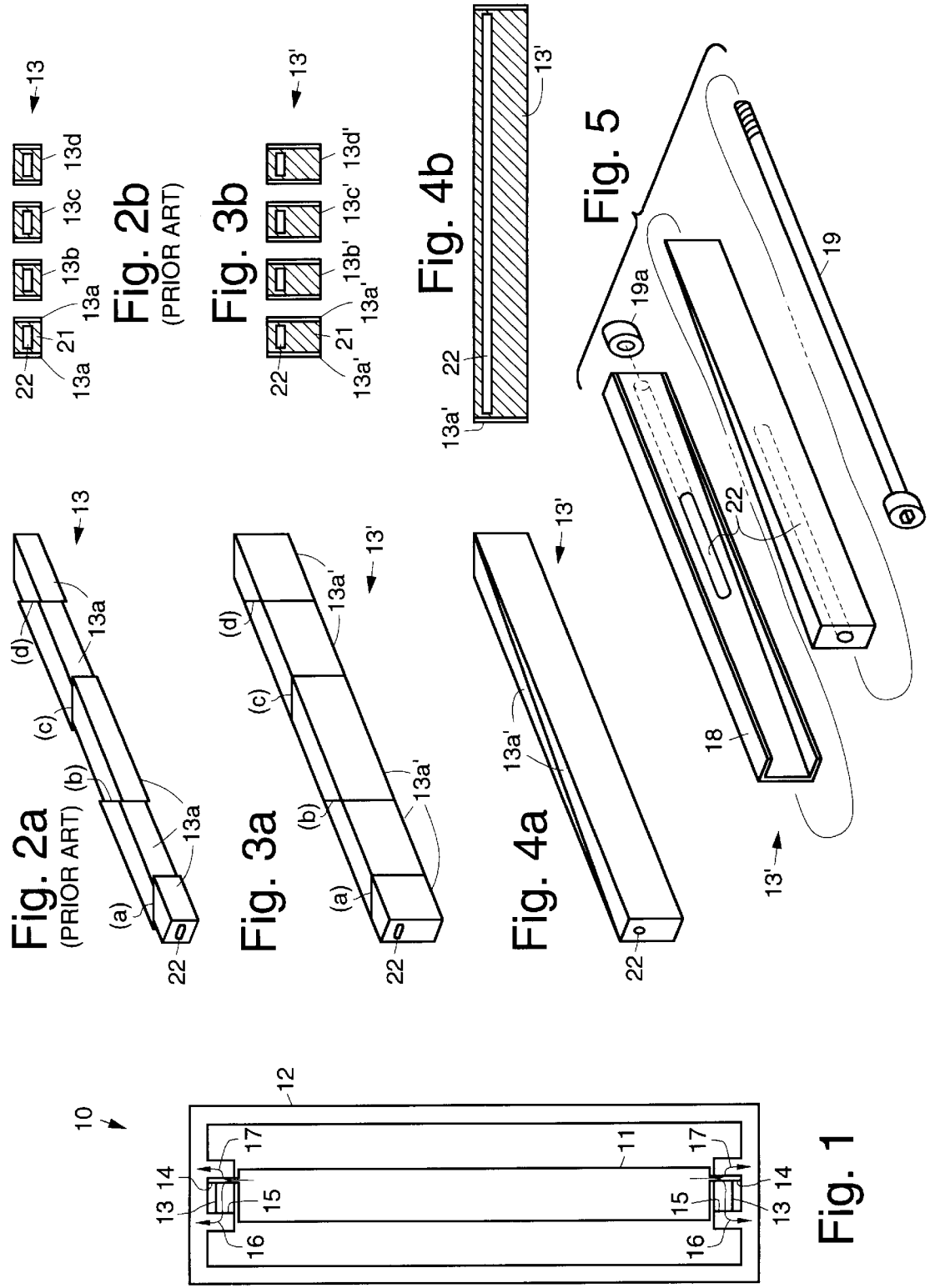

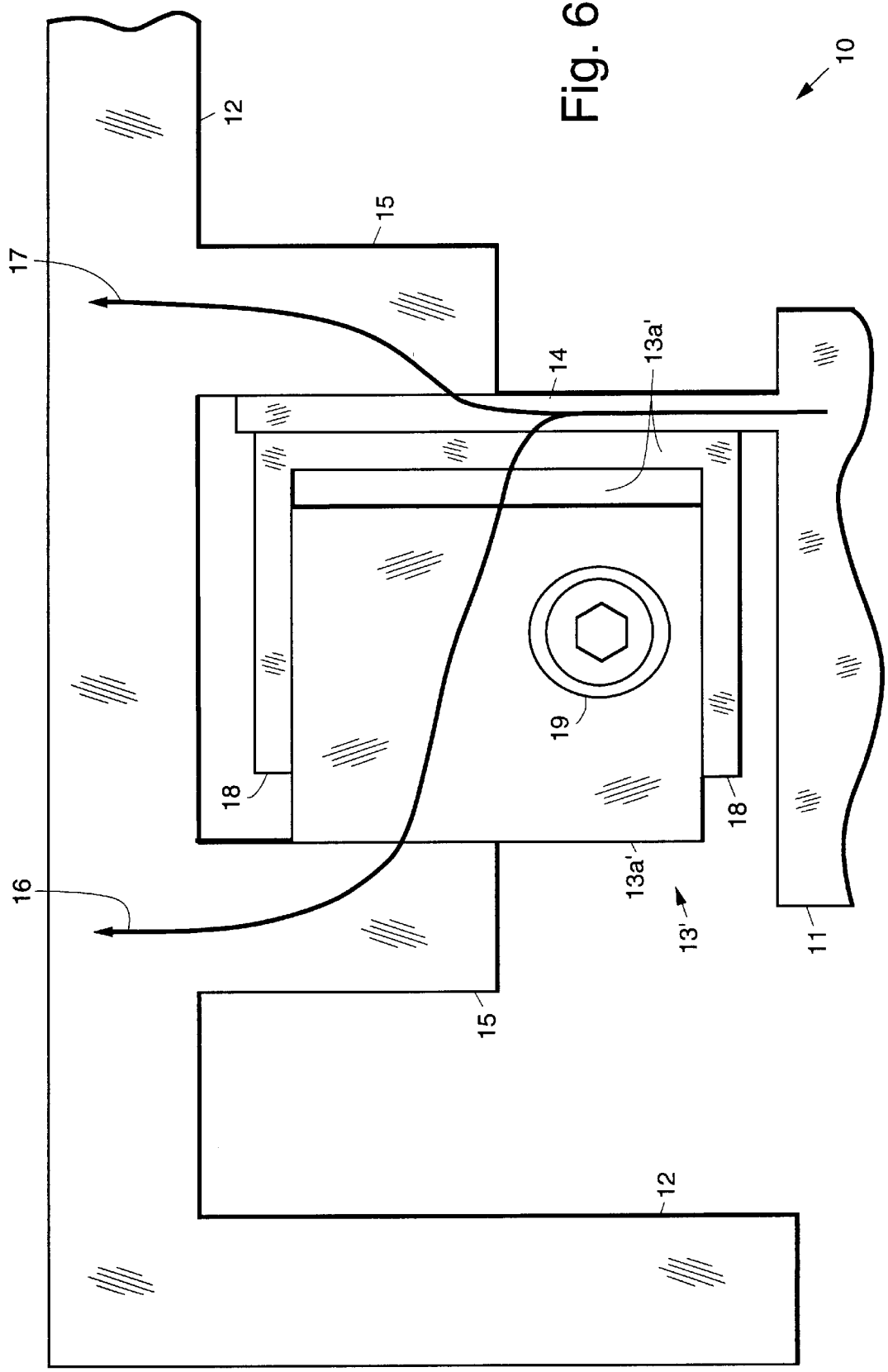

ELECTRONICS PACKAGE EMPLOYING A HIGH THERMAL PERFORMANCE WEDGELOCK

BACKGROUND

The present invention relates generally to electronic packages employing mechanical fasteners designed to secure circuit card assemblies in a housing, and more particularly, to an improved electronic package having a high thermal performance wedgelock that secures a circuit card assembly and improves the heat transferred from the circuit card assembly to a housing.

Semiconductor reliability is highly affected by the operating temperature at the junction between the die and the substrate. A 10° C. increase in junction temperature can decrease component reliability by up to 50 percent. Increased performance within the heat conductive path will allow electrical components to operate at lower temperatures under the same conditions, thereby improving reliability. For example, many military and commercial applications require semiconductor junction temperatures to be no higher that 100° C. to 110° C.

Enclosures that are designed to remove heat from circuit card assemblies by way of thermal conduction, such as those assemblies containing high power semiconductor devices, are increasingly challenged to remove higher levels of heat. This is because newly developed semiconductor devices typically contain more circuitry and therefore tend to generate higher heat loads, or because components are smaller, thus permitting the circuit cards to contain more components, thereby increasing amount of heat generated per card.

A wedgelock is a mechanical fastener designed to secure a circuit card assembly in a housing by expanding and applying contact pressure between the circuit card assembly and a card guide surface of the housing. A common style of wedgelock used with conductively cooled circuit card assemblies produced by the assignee of the present invention, for example, is made from aluminum and uses a five piece wedge assembly. The wedge assembly is used as a mechanical fastener to secure the circuit card assembly in the housing by expanding the wedges and causing pressure to be applied between a circuit card assembly card guide surface and either a thermal mounting plate, a thermal management layer, or a portion of the housing.

Heat transfer is achieved by the application of contact pressure between the thermal mounting plate and card guide surface. Conventional wedgelocks used by the assignee of the present invention, for example, are not designed to allow heat conduction through the wedgelocks. Estimates show that only three percent of the heat load is conducted through the conventional five piece aluminum wedgelock. This low heat conduction is due to the very small contact area between individual wedges when they are in an expanded condition to secure the circuit card assembly.

Accordingly, it is an objective of the present invention to provide for an improved electronic package and high thermal performance wedgelocks that secure a circuit card assembly in the package and improve the heat transferred from the circuit card assembly to a housing of the package.

SUMMARY OF THE INVENTION

To meet the above and other objectives, the present invention provides for an electronics package having thermally conductive wedgelocks (two of which are normally used per package). The wedgelocks have improved thermal conductivity and secure a circuit card assembly in a card guide slot formed in a housing of the electronics package. The circuit card assembly has a thermal mounting plate that is used to secure the assembly in the slot.

The thermally conductive wedgelock secures the circuit card assembly in the housing and conductively couples heat from the circuit card assembly to the housing by way of the card guide slot. The wedgelock provides a secondary heat path to the card guide slot to housing in addition to the primary heat path through the thermal mounting plate. Apparatus is provided for expanding the wedgelock in the card guide slot to secure the circuit card assembly therein. The thermally conductive wedgelock may be preferably made of copper or other metal having high thermal conductivity. The wedgelock preferably comprises two tapered wedges, and has a guide that prevents rotation between the adjacent wedges.

The thermally conductive wedgelock creates a relatively high efficiency secondary thermal path between a circuit card assembly and a housing in which it is secured. The wedgelock improves the heat transfer from the circuit card assembly to the housing. The high thermal performance wedgelock increases the amount of heat conducted through the interface between the circuit card assembly and its card guide by creating a secondary heat conduction path that allows the circuit card assembly to run cooler, thus increasing reliability of component on the circuit card assembly.

The high thermal performance wedgelock may be used in many different applications including commercial and high stress military environments where heat transfer from the circuit card assembly is accomplished primarily through conduction. The present invention was initially developed to support the use of commercial-of-the-shelf (COTS) circuit cards where a conversion from convective heat transfer to conductive heat transfer is required. The utilization of commercial-off-the-shelf circuit cards within military equipment is a key Department of Defense initiative and is being imposed on many new military development programs. Enhancing the performance of the conductive path using the present invention allows the use of higher heat dissipating circuit card assemblies or circuit card assemblies with lower performance internal heat conduction paths.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates an electronics package containing a conductively cooled circuit card assembly secured in a housing by means of two wedgelocks;

FIG. 2a illustrate a conventional wedgelock;

FIG. 2b illustrates the relative contact area between five wedges of the conventional wedgelock shown in FIG. 2a;

FIG. 3a illustrates a first wedgelock in accordance with the principles of the present invention that may be used in the electronics package of FIG. 1;

FIG. 3b illustrates the relative contact area between the five wedges shown in FIG. 3a;

FIG. 4a illustrates a second wedgelock in accordance with the principles of the present invention that may be used in the electronics package of FIG. 1;

FIG. 4b illustrates the relative contact area between the two wedges shown in FIG. 4a;

FIG. 5 shows an exploded view of a modified two piece wedgelock shown in FIGS. 4a and 4b; and FIG. 6 illustrates an enlarged side view of a portion of the electronics package of FIG. 1 showing the improved heat transfer between the circuit card assembly and the housing using the two piece wedgelock of FIG. 5.

DETAILED DESCRIPTION

Referring to the drawing figures, FIG. 1 illustrates an electronics package 10 comprising a conductively cooled circuit card assembly 11 secured in a housing 12 by means of a wedgelock 13. The circuit card assembly 11 contains semiconductor circuitry (not shown) and other components that generate heat that must be removed therefrom for proper operation. The circuit card assembly 11 is attached to a thermal mounting plate 14, for example, that is secured against a card guide slot 15 by means of the wedgelock 13.

The wedgelock 13 is a mechanical fastener designed to secure the circuit card assembly 11 in the housing 12 by expanding and applying contact pressure between the circuit card assembly 11 and the surface of the card guide slot 15. A typical prior art wedgelock 13 used with a conductively cooled circuit card assembly 11 is shown in FIG. 2a. The prior art wedgelock 13 is made from aluminum and uses a five individual wedges 13a. The wedge assembly mechanically secures the circuit card assembly 11 in the housing 12 by expanding the wedges using an expansion screw (not shown) and causing pressure to be applied between the surface of the card guide slot 15 and the thermal mounting plate 14.

Heat transfer is achieved by the application of contact pressure between the thermal mounting plate 14 and surface of the card guide slot 15. The conventional wedgelock 13 shown in FIG. 2a does not conduct heat through it very well. FIG. 2b shows the amount of surface contact that is present using the wedgelock 13 of FIG. 2a when it is expanded to secure the circuit card assembly 11 in the card guide slot 15. The four views shown in FIG. 2b illustrate contact areas 21 (crosshatched areas) at the juncture between each of the respective wedges 13, designated at locations (a), (b) (c), and (d), respectively. The clear area in the center of the views of FIG. 2b correspond to the location of a slot through which the expansion screw slides. The individual wedges 13a slide relative to each other so that contact areas 21 between each of the individual wedges 13 are much less that if they were in full contact. Estimates show that only 3 percent of the heat load is conducted through the conventional five wedge aluminum wedgelock 13. This low heat conduction is due to the very small contact area between individual wedges when they are in an expanded condition to secure the circuit card assembly 11 as is shown in FIG. 2b.

In order to overcome the limitations of the wedgelock 13 shown in FIG. 2a, the present invention provides for high thermal performance wedgelocks 13' that improve heat conduction by creating an effective secondary heat path 16 through the wedgelock 13' and into the adjacent card guide slot 15 and housing 12. The secondary heat path 16 that provides for improved heat conduction (depicted in FIG. 1), along with the normal primary heat path 17 through the thermal mounting plate 14 to the housing 12. FIGS. 3a and 3b, and FIGS. 4a and 4b illustrate two wedgelocks 13', respectively, in accordance with the principles of the present invention. The improved wedgelocks 13' may be preferentially used in the electronics package 10 of FIG. 1 to provide the secondary heat path 16 and improve the heat conduction from the circuit card assembly 11 to the housing 12.

Improved heat conduction of the present high thermal performance wedgelocks 13' is provided in several ways. The first is the use of copper or other high thermally conductive material to construct the wedgelocks 13' in place of the conventionally used aluminum material.

The second is to provide an increased surface contact area between wedges 13a' of the wedgelock 13 when they secure the circuit card assembly 11 by increasing the height of the wedgelock 13. This is illustrated in FIGS. 3a, 3b, 4a and 4b for the two embodiments, respectively. The four views shown in FIG. 3b illustrate contact areas 21' at the juncture between each of the respective wedges 13', designated at locations (a), (b) (c), and (d), respectively. The clear areas in the center of the views of FIGS. 3b and 4b correspond to location of slots or holes through which the expansion screw slides. FIG. 4b has a single view because only two wedges 13a' are used. Increased height is conditioned upon space availability within the card guide slot 15 and on the thermal mounting plate 14 or thermal management surface 14. The housing 12 and card guide slot 15 are appropriately designed to allow for this height increase.

The third is to provide for an increased surface area between the wedges 13a' making up the wedgelock 13' by using two long tapered wedges 13a' as illustrated in FIGS. 4a and 4b. The contact area between the wedges 13a' in this embodiment corresponds to the surface area where the two wedges 13a' contact each other, which is illustrated in FIG. 4b. The increased height of the wedgelock 13' improves heat conduction by increasing the area of contact within the card guide slot 15. In the case that the card guide slot cannot match the height of the wedge lock, the increased height wedgelock 13' can have the expansion hardware located outside of the heat transfer path. This relocation will cause a twisting action between the two wedges 13a' when the hardware is tightened.

FIG. 5 shows an exploded view of a modified two piece wedgelock 13' shown in FIGS. 4a and 4b. In the wedgelock 13' of FIG. 5, a guide 18 formed on one wedge 13a' that captivates that second wedge 13a' and prevents rotation between the adjacent wedges 13a'. A high strength expansion screw 19 may be used in place of a standard screw that cooperates with a captivating nut 19a to allow higher contact pressures to be achieved, thereby increasing thermal conductivity between the thermal mounting plate 14 and the card guide slot 15.

For the purposes of clarity, FIG. 6 illustrates an enlarged side view of a portion of the electronics package 10 of FIG. 1 showing the improved heat transfer between the circuit card assembly 11 and the housing 12 using the two piece wedgelock 13 shown in FIG. 5. The improved heat conduction created by the secondary heat path 16 through the wedgelock 13' and into the adjacent card guide slot 15 and housing 12 is more clearly shown. The secondary heat path 16 provides for improved heat conduction, and is used in conjunction with the primary heat path 17 through the thermal mounting plate 14 to the housing 12. The wedgelocks 13' shown in FIGS. 3a, 4a or 5 may be used in the electronics package 10 of FIG. 1 to provide the secondary heat path 16 and improve the heat conduction from the circuit card assembly 11 to the housing 12.

With the improvements incorporated into the high thermal performance wedgelock 13 described above, a 477 percent increase in contact area is achieved bringing the thermal conductivity up to approximately 19 percent of the heat load. This results in a thermal conductivity improvement of approximately 533 percent.

Thus, an improved high thermal performance wedgelock for use as a mechanical fastener for securing a circuit card assembly in a housing and improving the heat transferred from the circuit card assembly to the housing has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An electronics package comprising:

a housing;

a card guide slot formed in the housing;

a circuit card assembly having a thermal mounting plate in the card guide slot that is to be conductively cooled;

a thermally conductive wedgelock securing the circuit card assembly in the housing and conductively coupling heat from the circuit card assembly to the housing by way of the card guide slot, and wherein the wedgelock provides a primary heat path through the thermal mounting plate and card guide slot to the housing, and provides a secondary heat path through the wedgelock and the card guide slot to housing, the wedgelock comprising first and second tapered wedges, the first wedge having a U-shaped guide formed therein that captivates that second wedge and prevents rotation between the wedges; and means for expanding the wedgelock in the card guide slot to secure the circuit card assembly therein.

2. The electronics package of claim 1 wherein the thermally conductive wedgelock comprises copper.

* * * * *